United States Patent
Moore et al.

(10) Patent No.: US 6,515,904 B2
(45) Date of Patent: Feb. 4, 2003

(54) METHOD AND SYSTEM FOR INCREASING PROGRAMMING BANDWIDTH IN A NON-VOLATILE MEMORY DEVICE

(75) Inventors: Christopher S. Moore, San Jose, CA (US); Bendik Kleveland, Santa Clara, CA (US); Roger W. March, Santa Clara, CA (US); James M. Cleeves, Redwood City, CA (US); Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/895,960

(22) Filed: Jun. 29, 2001

(65) Prior Publication Data

US 2002/0136059 A1 Sep. 26, 2002

Related U.S. Application Data

(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.$^7$ ............................................. G11C 16/00
(52) U.S. Cl. ........................... 365/185.19; 365/185.22; 365/185.28
(58) Field of Search ...................... 365/185.19, 185.22, 365/185.28, 189.07

(56) References Cited

U.S. PATENT DOCUMENTS

| | | | |
|---|---|---|---|
| 4,763,305 A | * | 8/1988 | Kuo ............................ 365/201 |
| 4,860,259 A | | 8/1989 | Tobita ......................... 365/201 |
| 5,287,326 A | * | 2/1994 | Hirata .................... 365/189.07 |
| 5,442,589 A | | 8/1995 | Kowalski .................. 365/225.7 |
| 5,532,964 A | | 7/1996 | Cernea et al. .......... 365/189.09 |
| 5,600,593 A | | 2/1997 | Fong ....................... 365/185.19 |
| 5,654,917 A | * | 8/1997 | Ogura .................... 365/185.18 |
| 5,768,208 A | | 6/1998 | Bruwer et al. .............. 365/228 |
| 5,784,320 A | * | 7/1998 | Johnson .................. 365/189.07 |
| 5,864,503 A | | 1/1999 | Pascucci ................. 365/185.22 |
| 6,002,614 A | | 12/1999 | Banks .................... 365/189.01 |
| 6,011,715 A | | 1/2000 | Pasotti et al. ........... 365/185.03 |
| 6,034,882 A | | 3/2000 | Johnson et al. .............. 365/103 |
| 6,076,138 A | | 6/2000 | Shin ............................ 711/103 |
| 6,163,484 A | | 12/2000 | Uekubo .................... 365/185.2 |
| 6,163,848 A | | 12/2000 | Gephard et al. ............. 713/322 |
| 6,195,283 B1 | | 2/2001 | Rolandi et al. ......... 365/185.03 |

OTHER PUBLICATIONS

Information Disclosure Statement, 3 pages, Sep. 27, 2001.

* cited by examiner

*Primary Examiner*—Tan T. Nguyen
(74) *Attorney, Agent, or Firm*—Brinks Hofer Gilson & Lione

(57) ABSTRACT

The preferred embodiments described herein provide a method and system for increasing programming bandwidth in a non-volatile memory device. In one preferred embodiment, a memory device is provided with a plurality of bits to be stored in a respective plurality of memory cells along a wordline. Some of the bits represent a programmed state, and others represent an un-programmed state. The duration of the programming pulse applied to the wordline is determined by the number of bits that represent the programmed state. In another preferred embodiment, the plurality of bits to be stored in the memory device comprises a first set of bits representing a modification to the stored data and a second set of bits representing an un-programmed state. Other preferred embodiments are provided, and each of the preferred embodiments can be used alone or in combination with one another.

37 Claims, 4 Drawing Sheets

METHOD AND SYSTEM FOR INCREASING PROGRAMMING BANDWIDTH IN A NON-VOLATILE MEMORY DEVICE

CROSS-REFERENCE TO RELATED APPLICATIONS

This application claims the benefit of the following U.S. provisional applications, each of which was filed on Mar. 21, 2001: U.S. Provisional Application No. 60/277,794 U.S. Provisional Application No. 60/277,815 and U.S. Provisional Application No. 60/277,738 Each of the above-referenced applications is hereby incorporated by reference.

BACKGROUND

In programming a non-volatile memory cell, a programming pulse is applied on the wordline of the memory cell, and the bitline of the memory cell is driven to ground. After a period of time, the memory cell is placed in a programmed state. In some programming methods, the duration of the programming pulse is made relatively long to ensure that the memory cell will be programmed. Because the duration of the programming pulse is often set for worst-case conditions, this "over-provisioning" approach can result in excessive average programming time, power, and energy. Additional delays are introduced because memory cells are programmed on a wordline-to-wordline basis. Specifically, the duration of the programming pulse applied to a wordline is the same regardless of the number of memory cells that are to be programmed. For example, if the duration of the programming pulse is 10 microseconds per memory cell and there are 1024 memory cells along a wordline, a programming pulse is applied to the wordline for 10,240 microseconds even if only one memory cell is to be programmed. If the first memory cell is to be programmed, its bitline is driven to ground during the first 10 microseconds that the programming pulse is applied to the wordline; otherwise, the bitline is kept high. After the first 10 microseconds have passed, the second memory cell can be programmed by driving its bitline to ground. This process continues until the last memory cell along the wordline is given an opportunity to be programmed.

There is a need, therefore, for a method and system for increasing programming bandwidth in a non-volatile memory device.

SUMMARY

The present invention is defined by the following claims, and nothing in this section should be taken as a limitation on those claims.

By way of introduction, the preferred embodiments described below provide a method and system for increasing programming bandwidth in a non-volatile memory device. In one preferred embodiment, a memory device is provided with a plurality of bits to be stored in a respective plurality of memory cells along a wordline. Some of the bits represent a programmed state, and others represent an un-programmed state. The duration of the programming pulse applied to the wordline is determined by the number of bits that represent the programmed state. In another preferred embodiment, the plurality of bits to be stored in the memory device comprises a first set of bits representing a modification to the stored data and a second set of bits representing an un-programmed state. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 4 is an illustration of a memory array of a preferred embodiment.

DETAILED DESCRIPTION OF THE PRESENTLY PREFERRED EMBODIMENTS

The preferred embodiments described herein relate to increasing programming bandwidth in a non-volatile memory device (i.e., a memory device with memory cells whose data is not lost or altered when electrical power is removed). Although any suitable memory array can be used, in one preferred embodiment, the memory cell is part of a three-dimensional memory array, which provides important economies in terms of reduced size and associated reductions in manufacturing cost. Additionally, although any suitable type of memory cell can be used, in one preferred embodiment, the memory cell is a write-once memory cell comprising an antifuse and a diode, as described in U.S. Pat. No. 6,034,882 to Johnson et al. and U.S. patent application Ser. No. 09/638,428, both of which are hereby incorporated by reference. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 0. (Memory cells that support multiple programmed states can also be used.) Being write-once, the initial, un-programmed digital state cannot be restored once the memory cell is switched to the programmed digital state. Instead of being write-once, the memory cell can be write-many. Unlike the digital state of a write-once memory cell, the digital state of a write-many memory cell can be switched between "un-programmed" and "programmed" digital states. When referring to write-many memory cells, the un-programmed digital state refers to the digital state of the memory cell before a programming operation. Accordingly, the un-programmed digital state can refer to either Logic 0 or Logic 1 (in a two-state memory cell) and does not necessarily refer to the digital state in which that memory cell was fabricated.

Figure 1:
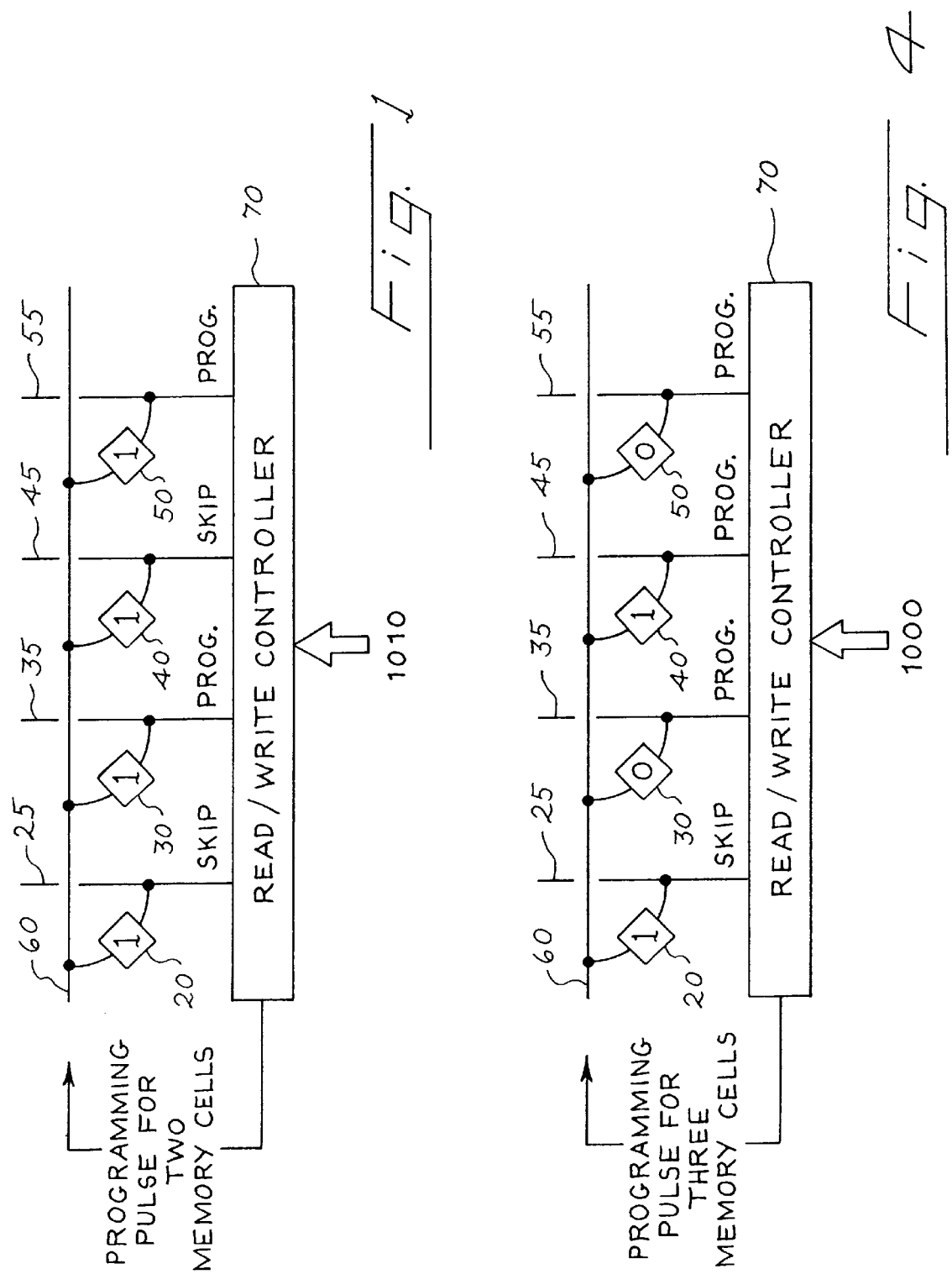
FIG. 1 is an illustration of a memory array of a preferred embodiment.

Turning now to the drawings, FIG. 1 is an illustration of a memory array of a preferred embodiment. The memory array comprises a plurality of memory cells 20, 30, 40, 50 along a wordline 60. Each of the memory cells 20, 30, 40, 50 has a respective bitline 25, 35, 45, 55. For simplicity, other memory cells, wordlines, and bitlines of the memory array are not shown in FIG. 1. The memory array also comprises a read/write controller 70 connected to the bitlines 25, 35, 45, 55 of the memory cells 20, 30, 40, 50. The read/write controller 70 is preferably an integrated circuit coupled with the column decoder. As used herein, the terms "connected to" and "coupled with" are intended broadly to cover components that are connected to or coupled with one another either directly or indirectly through one or more named or unnamed intervening components. It is important to note that although controller 70 is used for both read and write operations in this preferred embodiment, the controller 70 can be used exclusively for write operations or also used for other operations in addition to write (and read) operations.

To program a memory cell, suitable voltages are applied to the wordline and bitline associated with that memory cell. For example, to program memory cell 20, a programming pulse is applied on wordline 60, and the read/write controller 70 grounds bitline 25. In FIG. 1, memory cells 20, 30, 40, 50 are in the un-programmed, Logic 1 state, and bits 1010 are to be stored in memory cells 20, 30, 40, 50, respectively. Some of these bits represent the programmed state (Logic 0), and others represent the un-programmed state (Logic 0). Assume the duration of the programming pulse is 10 microseconds per memory cell. In prior programming approaches, the memory device would spend 40 microseconds to store the bits in the memory cells even though only two memory cells need to be programmed. With this preferred embodiment, the read/write controller 70 detects that only memory cells 30 and 50 need to be programmed and "skips" memory cells 20 and 40.

In operation, the read/write controller 70 skips memory cell 20, drives bitline 35 to ground for 10 microseconds to program memory cell 30, skips memory cell 40, and then drives bitline 55 to ground for 10 microseconds to program memory cell 50. After memory cell 50 has been programmed, the read/write controller 70 signals that the writing operation is complete, and the programming pulse is removed from wordline 60. In this way, the duration of the programming pulse applied on the wordline 60 is determined by a number of bits representing a programmed state that are to be stored in the memory cells 20, 30, 40, 50. Accordingly, the duration of the programming pulse applied to wordline 60 is long enough to program memory cells 30 and 50 but not long enough to program all of the memory cells 20, 30, 40, 50 along the wordline 60. This is shown schematically in FIG. 1 by the phrase "programming pulse for two memory cells." By skipping the memory cells that do not need to be programmed, programming bandwidth (the number of memory cells that can be programmed per unit time) increased by 50% in this example. In addition, reducing the amount of time the memory array is biased during a program operation can improve programming quality.

In some programming methods, the duration of the programming pulse per memory cell is over-provisioned to guarantee that the memory cell will be programmed. This approach can result in excessive programming time and power. For example, if a memory cell can be programmed by grounding its bitline for 2 microseconds instead of 10 microseconds, 8 microseconds are wasted for each memory cells. To farther increase programming bandwidth, it is preferred that the state of a memory cell be sensed while that memory cell is being programmed, as disclosed in "Memory Device and Method for Sensing while Programming a Non-Volatile Memory Cell," U.S. patent application Ser. No. 09/896,815, filed Jun. 29, 2001, which is hereby incorporated by reference. With this sensing technique, the duration of the programming pulse can be reduced from 10 microseconds per memory cell to 2 microseconds per memory cell.

Figure 2:
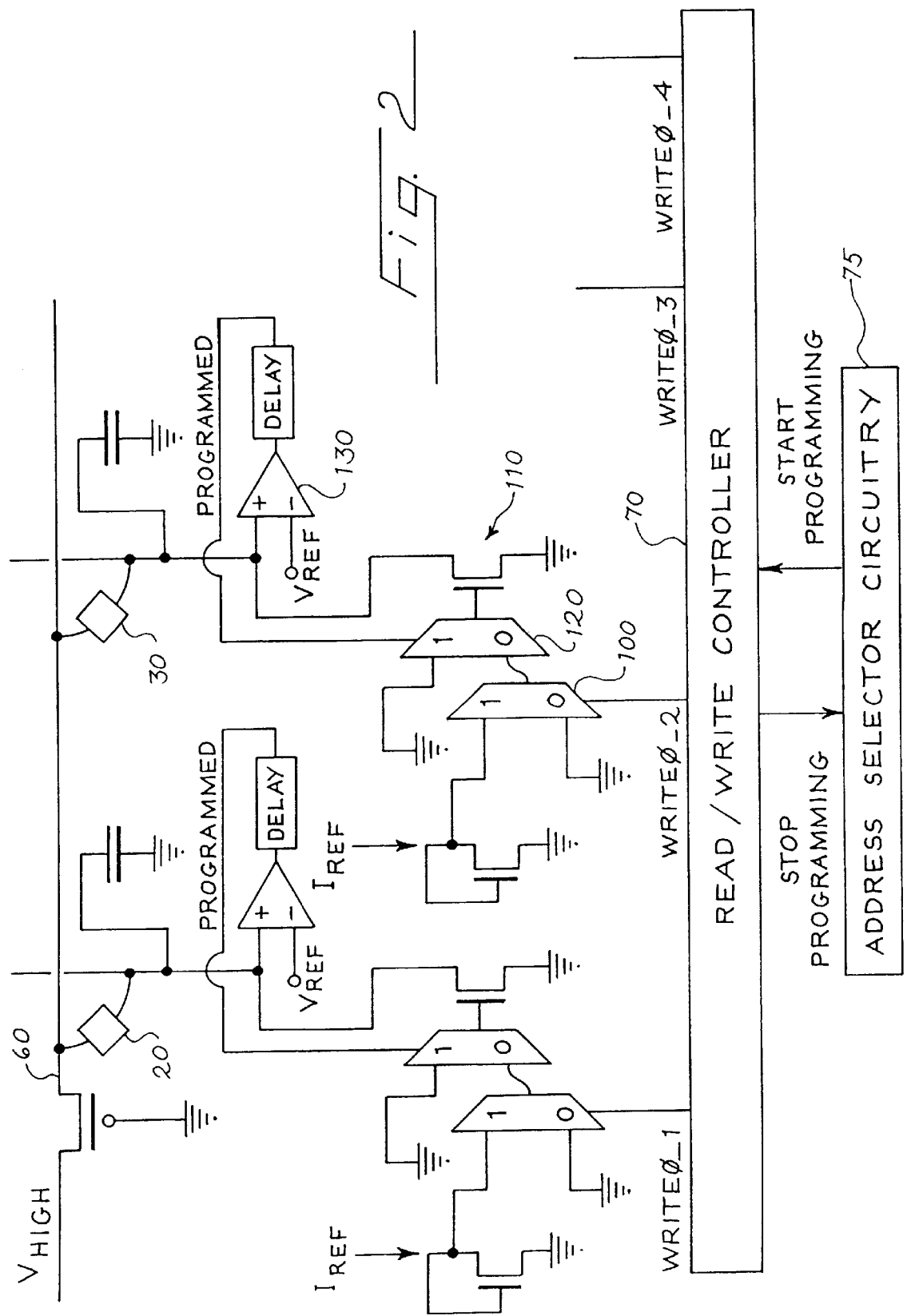
FIG. 2 is an illustration of a memory array of a preferred embodiment in which a read/write controller is operative to skip memory cells.

FIG. 2 is an illustration of the memory array of FIG. 1 implemented using one of the sensing-while-programming techniques disclosed in the above-referenced patent application. To simplify the drawing, memory cells 40 and 50 are not shown. In operation, address selector circuitry 75, which can include a row decoder and/or a column decoder, applies a "start programming" signal to the read/write controller 70. The read/write controller 70 skips memory cell 20 by applying a low signal on WRITE0_1 and programs memory cell 30 by applying a high signal on WRITE0_2. The high signal on WRITE0_2 selects input 1 of multiplexor 100, which applies a voltage of nbias to the gate of the pulldown transistor 110 via multiplexor 120. After the comparator 130 senses that memory cell 30 has been programmed, the pulldown transistor 110 is turned off. Read/write controller 70 then skips memory cell 40 by applying a low signal on WRITE0_3 and programs memory cell 50 by applying a high signal on WRITE0_4. After the comparator associated with memory cell 50 senses that memory cell 50 has been programmed, the read/write controller 70 sends a "stop programming" signal to the address selector circuitry 75, which removes the programming pulse from the wordline 60.

Figure 3:
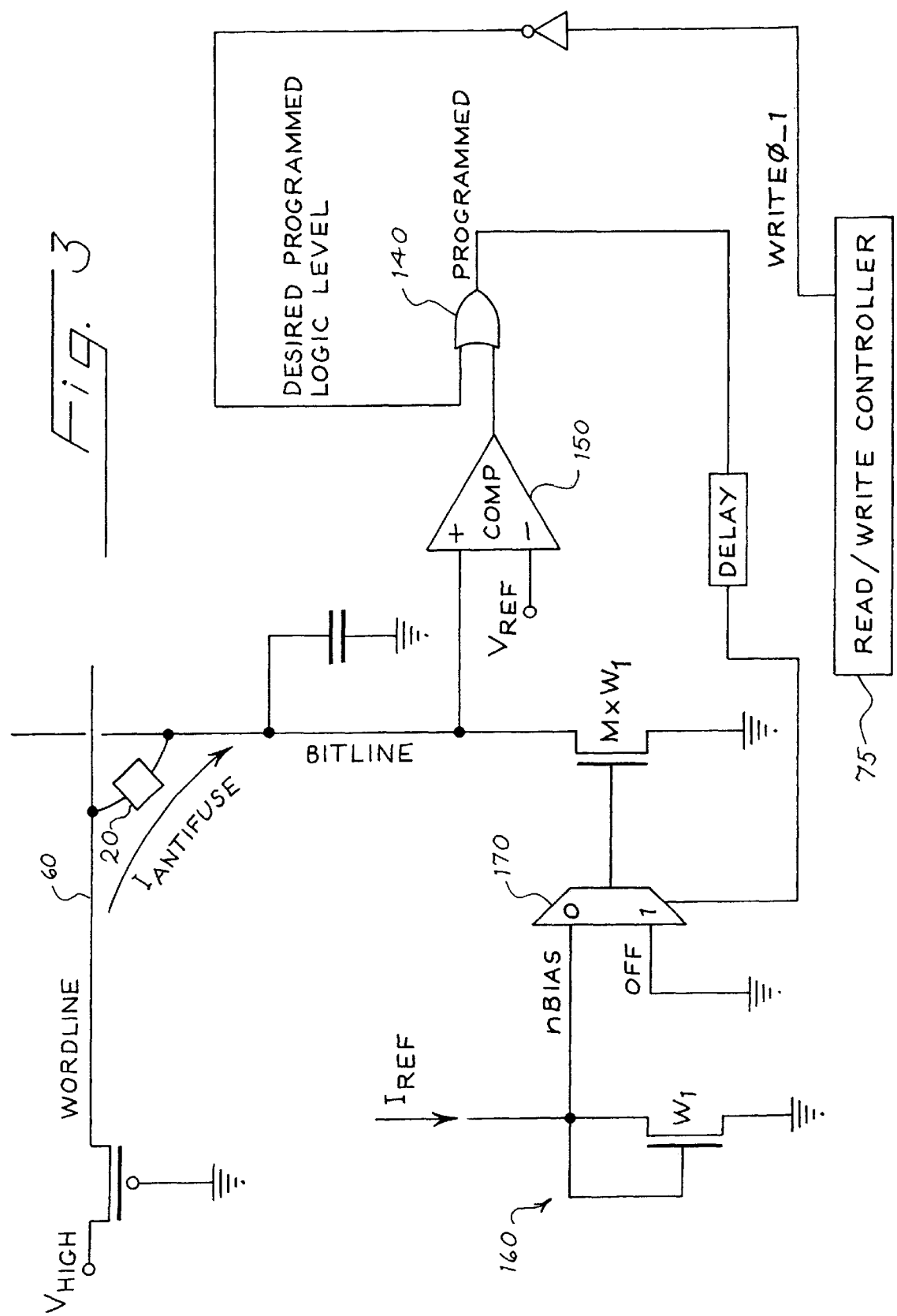
FIG. 3 is an illustration of an alternative embodiment of the memory array of FIG. 2.

It should be noted that any of the embodiments disclosed in the above-referenced patent application can be used. For example, instead of using a current-controlled bitline pulldown, a pulse-train-controlled bitline pulldown can be used. Additionally, while the memory cells were programmed sequentially in this example (i.e., bitline 55 was grounded after bitline 35 was grounded), memory cells can be simultaneously programmed (i.e., bitlines 35 and 55 can be grounded at the same time). Additionally, other alternative implementations can be used to skip bits. For example, in the above-described embodiments, the read/write controller 75 detected the logic state being written and skipped the appropriate memory cells by not grounding their bitlines. As an alternative to this "pre-write" technique of skipping bits, a "during write" technique can be used in which the bitlines of skipped memory cells are grounded, and detection circuitry associated with the memory cells is used to skip memory cells. For example, as shown in FIG. 3 with reference to memory cell 20, the WRITE0_1 signal can be applied (in inverted form) to an OR gate 140 following the comparator 150 instead of to a multiplexor interposed between the current mirroring transistor 160 and multiplexor 170. In operation, a low WRITE0_1 signal is inverted and supplied to the OR gate 140, which asserts the Programmed signal. In contrast, an inverted high WRITE0_1 signal supplies a 0 to the OR gate 140, and the Programmed signal is asserted only when the comparator 150 signals that memory cell 20 has been programmed. In another alternative, the read/write controller 75 is coupled to the comparator 150 and changes the reference voltage $V_{ref}$ based on the desired logic value so that the comparator 150 asserts the Programmed signal when leakage current is detected. This alternative can be implemented using a multiplexor or standard logic gates, for example.

Using the sensing-while-programming technique can also increase programming bandwidth when storing a bit representing a programmed state in a memory cell already in a programmed state. This advantage will be described in conjunction with FIGS. 1 and 4. After bits 1010 are stored in memory cells 20, 30, 40, 50 of FIG. 1, memory cells 30 and 50 are in the programmed state (Logic 0). Now assume that bits 1000 are to be stored in memory cells 20, 30, 40, 50 (see FIG. 4). Using the approach described above, the read/write controller 70 detects that memory cells 30, 40, and 50 need to be programmed because the last three bits of the new data are Logic 0. If the read/write controller 70 does not know that memory cells 30 and 50 have already been programmed, only memory cell 20 would be skipped, and the read/write controller 70 would drive bitlines 35, 45, and 55 to ground during the 10 microsecond programming time allotted to program each of those memory cells. Accordingly, the programming pulse will be applied for three memory cells even though only one memory cell needs to be programmed. However, if the sensing-while-programming technique were used, the detection circuitry associated with memory cells 30 and 50 would detect that these memory cells were in the programmed state in about 200 nanoseconds per each memory cell.

Figure 5:
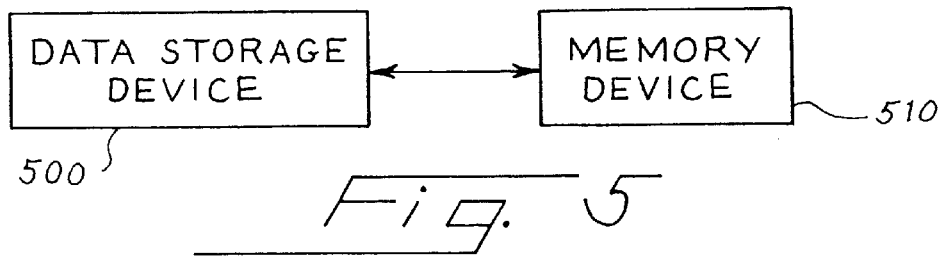
FIG. 5 is an illustration of a data storage device coupled with a memory device of a preferred embodiment.

Turning again to the drawings, FIG. 5 is an illustration of a data storage device 500 coupled with a memory device 510 of a preferred embodiment. The data storage device is a device that can field-program digital data into memory cells of the memory device 510. Examples of data storage devices include, but are not limited to, consumer devices such as a digital audio player, a digital audio book, an electronic book, a digital camera, a game player, a general-purpose computer, a personal digital assistant, a portable telephone, a printer, and a projector. Software and/or hardware in the data storage device 500 can be designed to take advantage of the bandwidth improvement associated with skipping bits. For example, often one wants to modify a section of a page of memory (e.g., 512 bytes) rather than writing the entire page. This is done very often when modifying file system structures, such as when adding an entry in the DOS file allocation table (FAT). In this case, bandwidth can be improved by masking 1s (the un-programmed state) around all the data except for what is desired to be written. Because the read/write controller of the memory device will skip 1s, the bandwidth for writing this page will be increased dramatically.

Figure 6:
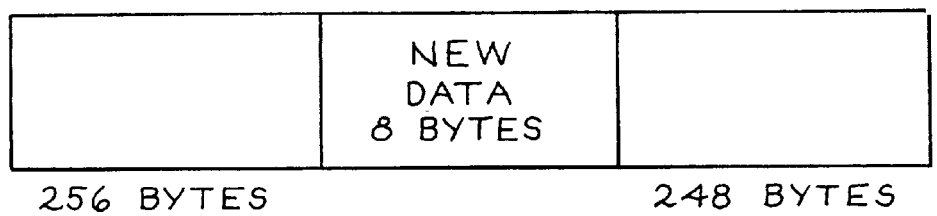
FIGS. 6–8 are illustrations of a preferred embodiment for modifying a section of a page of memory.
Figure 7:
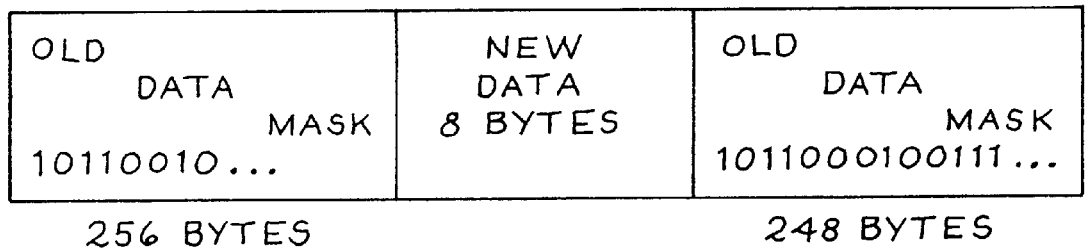
Figure 8:
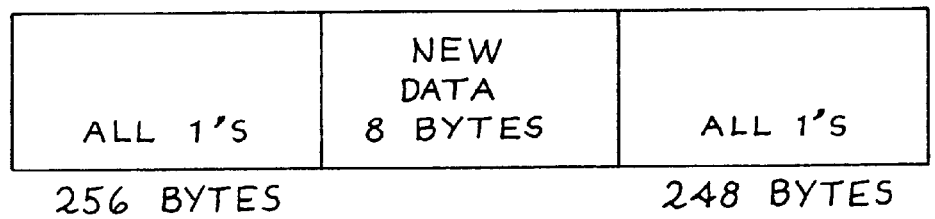

Consider, for example, the situation where one wishes to insert 8 bytes of new data into a page of data (see FIG. 6). In one approach, the old data is masked around the new data, and the entire page of data is written in the memory device 510 (see FIG. 7). Using the bit skipping techniques described above, bandwidth would be improved by skipping the 1s in both the old data mask (which includes 1s and 0s) and the new data. However, the memory cells storing the 0s of the old data would not be skipped even though they are already in the programmed state. To further improve bandwidth, instead of masking the old data before and after the new data, only 1s are placed around the new data so that all of the memory cells associated with the bytes before and after the new data would be skipped (see FIG. 8). Stated more generally, the data storage device 500 provides the memory device 510 with a plurality of bits (the page of data) comprising a first set of bits representing a modification (the new data) to the stored data (the previously-stored page) and a second set of bits representing the un-programmed state (Logic 0). As used herein, a "set" can include one or more than one member. Another benefit to this preferred embodiment is that a system software developer does not have to use as much system RAM to store data. To reduce programming errors, typically a programmer will mask around the desired area to be written with the values that are already contained in the page. If the data storage device 500 writes 1s around the desired data, system memory to contain the old data is not required.

In addition to adding new data to a page of data, this preferred embodiment can be used to increase bandwidth in the situation encountered in FIG. 4, where the read/write controller 70 does not know that memory cells 30 and 50 were already programmed. In FIG. 4, if the data storage device 500 realized that memory cells 30 and 50 were already in a programmed state, the data storage device 500 could send 1101 instead of 1000 to the memory device.

There are several alternatives that can be used with these preferred embodiments. For example, in the embodiments described above, the programming pulse was removed from the wordline when the read/write circuitry 70 sent a "stop programming" signal to address selector circuitry 75 after programming the appropriate memory cells. In this way, the duration of the programming pulse is determined by an action that takes place after the memory cells are programmed. As an alternative, the read/write circuitry 70 can determine how many memory cells need to be programmed and send this information to the address selector circuitry 75 before programming begins. The address selector circuitry 75 then applies a programming pulse of a duration suitable to program those memory cells. In this alternative, the duration of the programming pulse is determined by an action that takes place before the memory cells are programmed. Further, the functionality described with respect to the hardware and/or software components in the data storage device 500 can be distributed to the memory device as desired.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794 "Passive Element Memory Array and Related Circuits Useful Therefor," U.S. Provisional Application No. 60/277,815; "Three-Dimensional Memory Array," U.S. Provisional Application No. 60/277,738; and "Three-Dimensional Memory Array and Method of Fabrication," U.S. Application No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. patent application Ser. No. 09/897,705; "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/895,960; "Method and Apparatus for Discharging Memory Array Lines," U.S. patent application Ser. No. 09/897,784; "Current Sensing Method and Apparatus Particularly Useful for a Memory Array of Cells Having Diode-Like Characteristics," U.S. patent application Ser. No. 09/896,468; "Memory Array Incorporating Noise Detection Line," U.S. patent application Ser. No. 09/897,704; and "Memory Device and Method for Sensing while Programming a Non-Volatile Memory Cell," U.S. patent application Ser. No. 09/896,815.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for increasing programming bandwidth, the method comprising:
   (a) providing a plurality of bits to be stored in a respective plurality of memory cells along a wordline, wherein some of the bits represent a programmed state and others represent an un-programmed state; and
   (b) for each memory cell along the wordline regardless of the memory cell's content:
      (b1) if the bit to be stored in the memory cell represents the programmed state, programming the memory cell; and
      (b2) if the bit to be stored in the memory cell represents the un-programmed state, skipping the memory cell.

2. The invention of claim 1, wherein each memory cell comprises a respective bitline, wherein the memory cell is programmed in (b1) by grounding its bitline while a programming pulse is applied on the wordline, and wherein the memory cell is skipped in (b2) by not grounding its bitline while a programming pulse is applied on the wordline.

3. The invention of claim 2, wherein two or more memory cells are programmed by sequentially grounding their bitlines.

4. The invention of claim 2, wherein two or more memory cells are programmed by simultaneously grounding their bitlines.

5. The invention of claim 1, wherein each memory cell in the plurality of memory cells comprises an antifuse.

6. The invention of claim 1, wherein each memory cell in the plurality of memory cells comprises a write-once memory cell.

7. The invention of claim 1, wherein each memory cell in the plurality of memory cells comprises a write-many memory cell.

8. The invention of claim 1, wherein each memory cell in the plurality of memory cells comprises a field-programmable memory cell.

9. The invention of claim 1, wherein the plurality of memory cells is part of a three-dimensional memory array.

10. The invention of claim 1, wherein (b1) comprises:
    while the memory cell is being programmed, determining whether the memory cell is in a programmed state; and
    if the memory cell is determined to be in the programmed state, terminating the programming of the memory cell.

11. A memory device comprising;
    a plurality of memory cells along a wordline; and
    a controller operative to, for each memory cell regardless of the memory cell's content, determine whether a bit to be stored in the memory cell represents a programmed state or an un-programmed state; program the memory cell if the bit to be stored in the memory cell represents the programmed state; and skip the memory cell if the bit to be stored in the memory cell represents the un-programmed state.

12. The invention of claim 11, wherein each memory cell comprises a respective bitline, and wherein the controller programs a memory cell by grounding its bitline while a programming pulse is applied on the wordline and skips a memory cell by not grounding its bitline while a programming pulse is applied on the wordline.

13. The invention of claim 12, wherein the controller is operative to program two or more memory cells by sequentially grounding their bitlines.

14. The invention of claim 12, wherein the controller is operative to program two or more memory cells by simultaneously grounding their bitlines.

15. The invention of claim 11, wherein each memory cell in the plurality of memory cells comprises an antifuse.

16. The invention of claim 11, wherein each memory cell in the plurality of memory cells comprises a write-once memory cell.

17. The invention of claim 11, wherein each memory cell in the plurality of memory cells comprises a write-many memory cell.

18. The invention of claim 11, wherein each memory cell in the plurality of memory cells comprises a field-programmable memory cell.

19. The invention of claim 11, wherein the plurality of memory cells is part of a three-dimensional memory array.

20. A memory device comprising:
    a plurality of memory cells along a wordline; and
    a controller operative to apply a programming pulse on the wordline of a duration determined by a number of bits representing a programmed state that are to be stored in the plurality of memory cells;
    wherein each memory cell comprises a detection circuit operative to detect, while that memory cell is being programmed, when that memory cell is in a programmed state.

21. A method for increasing programming bandwidth, the method comprising:
    (a) with a data storage device, masking bits that represent new data to be written into a plurality of memory cells of a memory device with bits that represent an un-programmed state, thereby generating a plurality of bits, some of which represent a programmed state and others of which represent the un-programmed state;
    (b) sending the plurality of bits from the data storage device to the memory device; and
    (c) for each memory cell of the plurality of memory cells:
       (c1) if the bit to be stored in the memory cell represents the programmed state, programming the memory cell; and
       (c2) if the bit to be stored in the memory cell represents the un-programmed state, skipping the memory cell.

22. The invention of claim 21, wherein the memory cell is programmed in (c1) by grounding its bitline while a programming pulse is applied on its wordline, and wherein the memory cell is skipped in (c2) by not grounding its bitline while a programming pulse is applied on its wordline.

23. The invention of claim 21, wherein the plurality of memory cells stores a page of data.

24. The invention of claim 21, wherein the plurality of memory cells stores a file system structure, and wherein the new data comprises a modification to the file system structure.

25. The invention of claim 21, wherein the plurality of memory cells stores a file allocation table, and wherein the new data comprises an entry to the file allocation table.

26. The invention of claim 21, wherein each memory cell in the plurality of memory cells comprises an antifuse.

27. The invention of claim 21, wherein each memory cell in the plurality of memory cells comprises a write-once memory cell.

28. The invention of claim 21, wherein each memory cell in the plurality of memory cells comprises a write-many memory cell.

29. The invention of claim 21, wherein each memory cell in the plurality of memory cells comprises a field-programmable memory cell.

30. The invention of claim 21, wherein the plurality of memory cells is part of a three-dimensional memory array.

31. A system for increasing programming bandwidth, the system comprising:
- a memory device comprising a plurality of memory cells along a wordline and a controller; and
- a data storage device coupled with the memory device and operative to generate a plurality of bits by masking bits that represent new data to be written into the plurality of memory cells with bits that represent an un-programmed state, whereby some of bits of the plurality of bits represent a programmed state and others represent the un-programmed state;
- wherein the controller is operative to, for each memory cell, determine whether a bit to be stored in the memory cell represents the programmed state or the un-programmed state; program the memory cell if the bit to be stored in the memory cell represents the programmed state; and skip the memory cell if the bit to be stored in the memory cell represents the un-programmed state.

32. The invention of claim 31, wherein each memory cell in the plurality of memory cells comprises an antifuse.

33. The invention of claim 31, wherein each memory cell in the plurality of memory cells comprises a write-once memory cell.

34. The invention of claim 31, wherein each memory cell in the plurality of memory cells comprises a write-many memory cell.

35. The invention of claim 31, wherein each memory cell in the plurality of memory cells comprises a field-programmable memory cell.

36. The invention of claim 31, wherein the plurality of memory cells is part of a three-dimensional memory array.

37. A system for increasing programming bandwidth, the system comprising:
- a memory device comprising:
  - a plurality of memory cells along a wordline; and
  - a controller operative to apply a programming pulse on the wordline of a duration determined by a number of bits representing a programmed state that are to be stored in the plurality of memory cells; and
- a data storage device coupled with the memory device and operative to provide the memory device with a plurality of bits to be stored in the plurality of memory cells, wherein the plurality of bits comprises a first set of bits representing a modification to data stored in the plurality of memory cells and a second set of bits representing an un-programmed state;
- wherein each memory cell comprises a detection circuit operative to detect, while that memory cell is being programmed, when that memory cell is in a programmed state.

* * * * *